United States Patent
Furuichi et al.

(10) Patent No.: US 9,664,768 B2
(45) Date of Patent: May 30, 2017

(54) MAGNETIC SENSOR

(71) Applicant: DENSO CORPORATION, Kariya, Aichi-pref. (JP)

(72) Inventors: Takamoto Furuichi, Nagoya (JP); Toshifumi Yano, Obu (JP); Hisanori Yokura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 309 days.

(21) Appl. No.: 14/390,413

(22) PCT Filed: Apr. 17, 2013

(86) PCT No.: PCT/JP2013/002595
§ 371 (c)(1),
(2) Date: Oct. 3, 2014

(87) PCT Pub. No.: WO2013/161219
PCT Pub. Date: Oct. 31, 2013

(65) Prior Publication Data
US 2015/0042319 A1     Feb. 12, 2015

(30) Foreign Application Priority Data

Apr. 23, 2012  (JP) .................................. 2012-098009
Apr. 5, 2013  (JP) .................................. 2013-079703

(51) Int. Cl.
*G01R 35/00*   (2006.01)
*G01R 33/09*   (2006.01)
*B82Y 25/00*   (2011.01)

(52) U.S. Cl.
CPC ........... *G01R 35/00* (2013.01); *G01R 33/093* (2013.01); *G01R 33/096* (2013.01); *G01R 33/098* (2013.01); *B82Y 25/00* (2013.01)

(58) Field of Classification Search
CPC ... G01R 33/09–33/098; G01R 33/0023; G01R 33/0029; G01R 33/02; G01R 33/06;
(Continued)

(56) References Cited

U.S. PATENT DOCUMENTS 6,098,464 A     8/2000  Avisse et al.
6,373,242 B1 *  4/2002  Wappling ............... B82Y 25/00
                                              324/207.21
(Continued)

FOREIGN PATENT DOCUMENTS

EP    1 544 579 A      6/2005
JP    09-270550 A     10/1997
JP    09270550 A  *   10/1997

OTHER PUBLICATIONS

Office Action mailed Dec. 9, 2014 issued in corresponding JP patent application No. 2013-079703 (and English translation).
(Continued)

*Primary Examiner* — Huy Q Phan
*Assistant Examiner* — David Frederiksen
(74) *Attorney, Agent, or Firm* — Posz Law Group, PLC

(57) ABSTRACT

A TMR element and a corrective AMR element are series-connected between a power supply and a ground. The resistance value of the corrective AMR element is set so as to offset an output error in the rotation angle of an external magnetic field, which is included in the resistance value of the TMR element. The resistance value of the corrective AMR element is smaller than that of the TMR element. An increased voltage can be applied from the power supply to the TMR element. It is possible to increase, in the resistance value of the TMR element, the amount of change that depends on the rotation angle of the external magnetic field. This makes it possible to increase, in the output of a magnetic sensor, the amount of change that depends on the
(Continued)

rotation angle of the external magnetic field. The sensitivity of the magnetic sensor can be increased.

30 Claims, 11 Drawing Sheets

(58) Field of Classification Search
CPC ...... G01R 35/00; G01D 3/028–3/0365; B82Y 25/00
See application file for complete search history.

(56) References Cited

U.S. PATENT DOCUMENTS

| | | | | |
|---|---|---|---|---|
| 7,005,958 | B2* | 2/2006 | Wan | G01R 33/093 324/252 |
| 7,138,798 | B1 | 11/2006 | Abe et al. | |
| 2003/0107847 | A1* | 6/2003 | Saito | B82Y 10/00 360/314 |
| 2007/0047152 | A1* | 3/2007 | Furukawa | G01R 33/093 360/319 |
| 2008/0100290 | A1* | 5/2008 | Shoji | B82Y 25/00 324/252 |
| 2008/0191694 | A1* | 8/2008 | Barton | G01R 33/09 324/252 |
| 2010/0211345 | A1* | 8/2010 | Von Zon | B82Y 25/00 702/94 |
| 2010/0321010 | A1* | 12/2010 | van Veldhoven | B82Y 25/00 324/225 |
| 2011/0025318 | A1 | 2/2011 | Saruki et al. | |
| 2011/0025319 | A1 | 2/2011 | Saruki et al. | |
| 2011/0031965 | A1 | 2/2011 | Saruki et al. | |
| 2012/0098533 | A1* | 4/2012 | Zimmer | G01R 33/098 324/252 |

OTHER PUBLICATIONS

International Search Report and Written Opinion of the International Searching Authority mailed Aug. 6, 2013 for the corresponding International application No. PCT/JP2013/002595 (and English translation).
Examination Report mailed May 19, 2015 in the corresponding JP application No. 2013-079703 (and English translation).

* cited by examiner

MAGNETIC SENSOR

CROSS REFERENCE TO RELATED APPLICATION

The present application is a U.S. national stage application of PCT/JP2013/002595 filed on Apr. 17, 2013 and is based on Japanese Patent Application No. 2012-98009 filed on Apr. 23, 2012 and Japanese Patent Application No. 2013-79703 filed on Apr. 5, 2013, the disclosures of which are incorporated herein by reference.

TECHNICAL FIELD

The present disclosure relates to a magnetic sensor that detects an external magnetic field.

BACKGROUND ART

As shown in FIG. 15, a certain conventional angle sensor that uses a TMR element 1 includes a free layer 2, a pin layer 3, and a tunnel layer 4. The tunnel layer 4 is inserted between the free layer 2 and the pin layer 3.

In order to detect an external magnetic field, the free layer 2 includes a ferromagnet whose magnetization direction Ha rotates in accordance with an external magnetic field. The pin layer 3 includes a ferromagnet whose magnetization direction Hb is fixed in one direction. The tunnel layer 4 varies a tunnel current in accordance with a spin state prevailing between the free layer 2 and the pin layer 3.

The above-described TMR element 1 varies the resistance value of the tunnel layer 4 when the direction of the external magnetic field varies. More specifically, when the external magnetic field is given to the TMR element 1 in a direction parallel to the magnetization direction Hb of the pin layer 3, the resistance value of the tunnel layer 4 is minimized. When, on the other hand, the external magnetic field is given to the TMR element 1 in a direction antiparallel (that is, opposite) to the magnetization direction Hb of the pin layer 3, the resistance value of the tunnel layer 4 is maximized.

Consequently, the current flowing between the free layer 2 and pin layer 3 of the TMR element 1 (which is marked "OUTPUT" in FIG. 15) varies with the direction Y of the external magnetic field as indicated in the graph of FIG. 15. Hence, the direction Y of the external magnetic field can be measured when the current flowing between the free layer 2 and pin layer 3 of the TMR element 1 is monitored as the output of the TMR element 1.

Here, suppose that the angle between the direction Y of the external magnetic field and the magnetization direction Hb of the magnetization fixing layer is defined as the rotation angle (deg) of the external magnetic field. When the rotation angle is zero, the output of the TMR element 1 is maximized; when the rotation angle is 180 or −180 degrees, it is minimized. In other words, the relationship between the actual output of the TMR element 1 is the rotation angle (deg) of the external magnetic field is represented by a curve similar to a COS curve.

However, the actual output of the TMR element 1 (see a solid curve in the graph of FIG. 16) includes various components. Therefore, the relationship between the actual output of the TMR element 1 and the rotation angle of the external magnetic field cannot be represented by an ideal COS curve. Hence, the difference between the actual output of the TMR element 1 and the ideal COS curve becomes an error in the measurement of the rotation angle of the external magnetic field. This results in a decrease in the accuracy of rotation angle measurement.

In view of the circumstances, a magnetic sensor proposed, for instance, in Patent Literature 1 includes a bridge circuit, which is formed of first to fourth TMR elements to detect an external magnetic field, and a corrective TMR element, which corrects a measurement error.

In the above-mentioned magnetic sensor, the bridge circuit and the corrective TMR element are series-connected between a power supply and a ground to reduce an error in the measurement of the rotation angle of the external magnetic field; the error is included in the output of the bridge circuit.

PRIOR ART LITERATURES

Patent Literature

[Patent Literature 1] JP 2011-33456 A

The above-mentioned magnetic sensor, which is proposed in Patent Literature 1, is configured so that the bridge circuit and the corrective TMR element are series-connected between the power supply and the ground to reduce an error in the measurement of the rotation angle of the external magnetic field; the error is included in the output of the bridge circuit. However, the resistance value of the corrective TMR element is great. Therefore, a decreased voltage is applied from the power supply to the bridge circuit. Hence, in the resistance value, the amount of change, which depends on the rotation angle of the external magnetic field, is decreased in the first to fourth TMR elements included in the bridge circuit. This decreases, in the output of the bridge circuit, the amount of change that depends on the rotation angle of the external magnetic field. As a result, the sensitivity of the magnetic sensor is reduced.

SUMMARY OF INVENTION

It is an object of the present disclosure to provide a magnetic sensor that exhibits high sensitivity while reducing the error in the measurement of an external magnetic field.

To achieve the above object, according to an aspect of the present disclosure, a magnetic sensor is provided to include a magnetoresistive element and an anisotropic magnetoresistive element. The magnetoresistive element includes the following: a magnetization fixing layer whose magnetization direction is fixed with respect to an external magnetic field; a ferromagnetic layer whose magnetization direction rotates in accordance with the external magnetic field; and a non-magnetic interlayer that is sandwiched between the magnetization fixing layer and the ferromagnetic layer, the non-magnetic interlay having a resistance value that varies in accordance with an angle between the magnetization direction of the magnetization fixing layer and the magnetization direction of the ferromagnetic layer. The anisotropic magnetoresistive element has a resistance value that is smaller than a resistance value of the magnetoresistive element and varies with a rotation angle of the external magnetic field. The external magnetic field is measured in accordance with a combined resistance value obtained by combining the resistance value of the magnetoresistive element and the resistance value of the anisotropic magnetoresistive element.

For example, when a corrective TMR element, which is substituted for the anisotropic magnetoresistive element, and the magnetoresistive element are series-connected between the power supply and the ground, the resistance value of the corrective TMR element is greater than that of the anisotropic magnetoresistive element. Therefore, the power supply results in applying a decreased voltage to the magnetoresistive element.

Meanwhile, according to the above aspect, the resistance value of the anisotropic magnetoresistive element is smaller than that of the magnetoresistive element. Therefore, when the magnetoresistive element and the anisotropic magnetoresistive element are series-connected between the power supply and the ground, the power supply is permitted to apply an increased voltage to the magnetoresistive element. In contrast, when the magnetoresistive element and the anisotropic magnetoresistive element are parallel-connected between the power supply and the ground, the power supply is also permitted to apply an increased voltage to the magnetoresistive element. This increases, in the resistance value of the magnetoresistive element, the amount of change that depends on the rotation angle of the external magnetic field (or on the intensity of the external magnetic field). Consequently, the sensitivity of the magnetic sensor can be increased.

Further, according to the above aspect, the magnetic sensor is configured as described above to measure the external magnetic field by using a combined resistance value, which is obtained by combining the resistance value of the magnetoresistive element and the resistance value of the anisotropic magnetoresistive element. Therefore, the resistance value of the anisotropic magnetoresistive element can offset, in the rotation angle, the output error that is included in the resistance value of the magnetoresistive element.

As is obvious from the above, the magnetic sensor provided by the present disclosure exhibits high sensitivity while reducing the error in the measurement of the rotation angle of an external magnetic field.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Embodiments of the present disclosure will now be described with reference to the accompanying drawings. In the following description of the embodiments, elements identical or equivalent to each other are designated by the same reference signs for brevity of explanation.

First Embodiment

Figure 1:
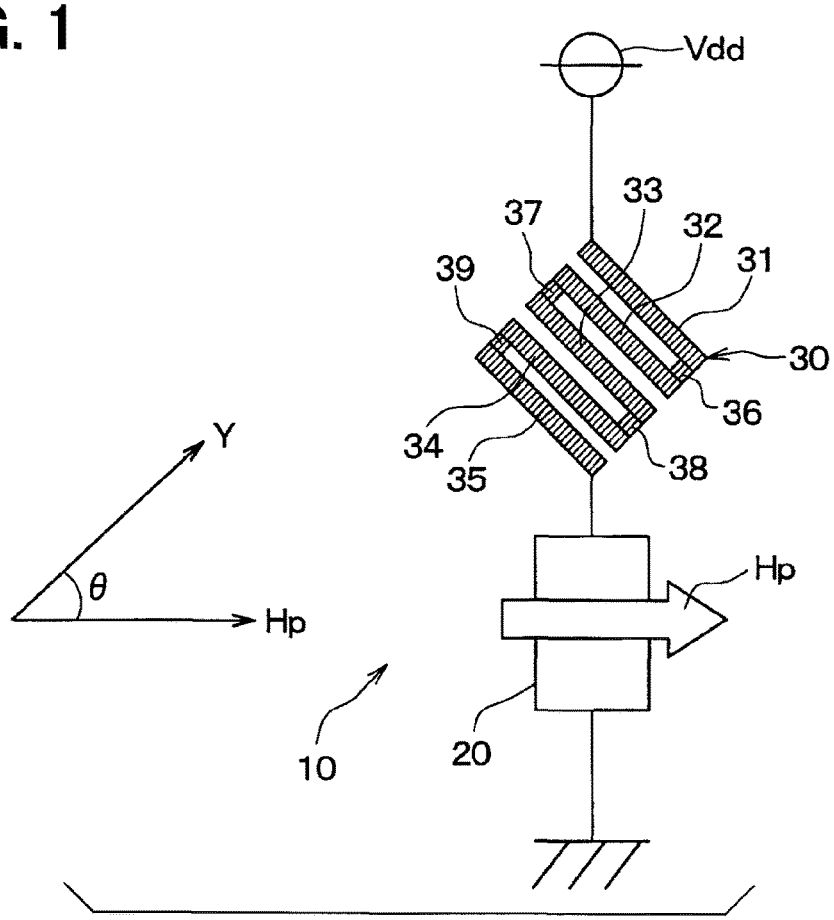
FIG. 1 is a diagram illustrating the configuration of a magnetic sensor according to a first embodiment of the present disclosure.

FIG. 1 shows the circuit configuration of a magnetic sensor 10 according to a first embodiment of the present disclosure. The magnetic sensor 10 includes a TMR (Tunnel Magneto-Resistance) element 20 and a corrective AMR (Anisotropic Magneto-Resistance) element 30. The TMR element 20 and the corrective AMR element 30 are series-connected between a power supply Vdd and a ground. The TMR element 20 is disposed in between the power supply Vdd and the corrective AMR element 30.

In the present embodiment, the TMR element 20 and the corrective AMR element 30 are formed in the same plane. For example, the TMR element 20 and the corrective AMR element 30 are formed to be like a membrane on an underlying insulating film formed on a substrate.

The TMR element 20 is a tunnel magnetoresistive element that includes a free layer, a pin layer, and a tunnel layer. The free layer is a ferromagnetic layer that includes a ferromagnet to detect direction Y of an external magnetic field. The magnetization direction of the free layer rotates in accordance with the external magnetic field. The pin layer 22 is a magnetization fixing layer that includes a ferromagnet whose magnetization direction Hp is fixed in one direction with respect to the external magnetic field. The tunnel layer is a non-magnetic interlayer that varies a tunnel current flowing between the free layer and the pin layer in accordance with a spin state prevailing between the free layer and the pin layer. In other words, the TMR element 20 is capable of measuring the rotation angle of the external magnetic field by using the value of resistance between the free layer and the pin layer. The rotation angle of the external magnetic field is the angle (deg) between direction Y of the external magnetic field and the magnetization direction Hp of the pin layer 22.

The corrective AMR element 30 is formed of a ferromagnet. The direction of easy axis of magnetization is determined by its shape anisotropy. The corrective AMR element 30 is an anisotropic magnetoresistive element whose resistance value varies with the rotation angle of the external magnetic field (see FIG. 4). In other words, when the current flowing in the corrective AMR element 30 is output, the output of the corrective AMR element 30 varies with the rotation angle of the external magnetic field.

The corrective AMR element 30 is formed by bending a single electrically conductive path in a serpentine configuration. The later-described angle of the direction of easy axis of magnetization and dimensional ratio of the corrective AMR element 30 are set so that the resistance value of the corrective AMR element 30 offsets, of the resistance value of the TMR element 20, the output error in the rotation angle of the external magnetic field. Hence, the rotation angle of the external magnetic field is measured by using a combined resistance value, which is obtained by combining the resistance value of the TMR element 20 and the resistance value of the corrective AMR element. Here, the output error in the rotation angle of the external magnetic field is an error component other than a resistance value indicative of the rotation angle of the external magnetic field, out of the resistance value of the TMR element 20.

The corrective AMR element 30 according to the present embodiment is formed of the above-mentioned single conductive path, which is obtained by parallelly arranging linearly extended conductive paths 31-35 and joining two adjacent conductive paths of the conductive paths 31-35 with connection members 36-39. The resistance value of the corrective AMR element 30 is set to be smaller than the resistance value of the TMR element 20. For example, the resistance value Ra of the corrective AMR element 30 is set to be not greater than 1/10 the resistance value Rb of the TMR element 20 (Ra≤Rb/10).

Here, the dimensional ratio of the corrective AMR element 30 is the ratio between the longitudinal dimension L of the conductive path and the widthwise dimension W of the conductive path.

The direction of easy axis of magnetization of the corrective AMR element 30 according to the present embodiment is the same as a longitudinal direction in which the conductive paths 31, 32, 33, 34, 35 are extended (namely, the direction in which a current flows in the conductive paths 31-35).

The angle of the direction of easy axis of magnetization is the angle between the direction of easy axis of magnetization and the magnetization direction Hp of the pin layer 22 of the TMR element 20. More specifically, the angle of the direction of easy axis of magnetization is an angle formed clockwise between the magnetization direction Hp and the direction of easy axis of magnetization. In the present embodiment, for example, the angle of the direction of easy axis of magnetization is set to 135 degrees clockwise in FIG. 1.

The corrective AMR element 30 according to the present embodiment includes one metal, namely, Ni (nickel), Fe (iron), or Co (cobalt). Alternatively, however, the corrective AMR element 30 may include a metal alloy that includes two or more of Ni, Fe, and Co.

Figure 2:
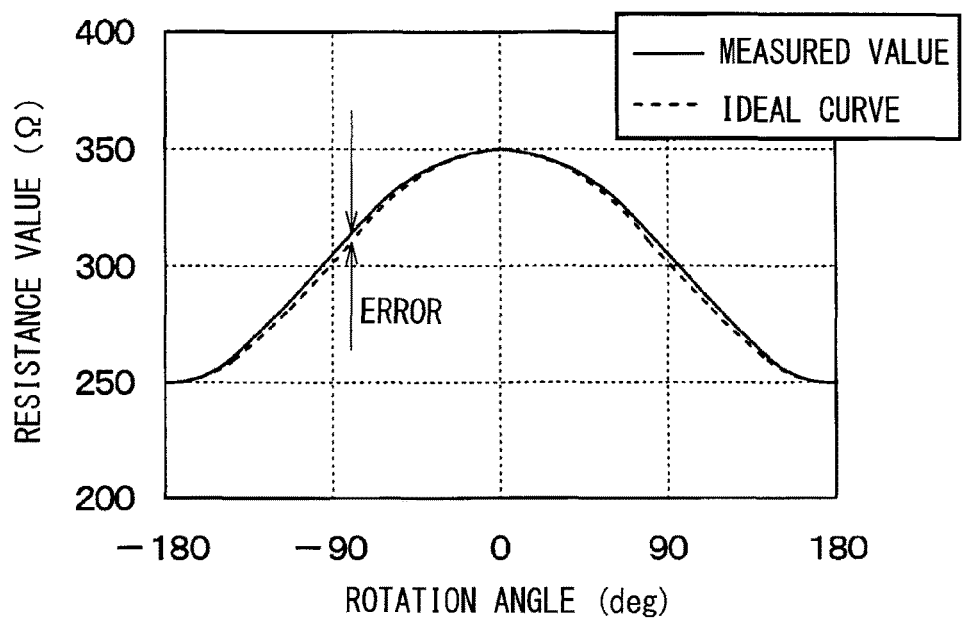
FIG. 2 is a graph illustrating the relationship between a measured resistance value of a TMR element in the magnetic sensor according to the first embodiment and the rotation angle of an external magnetic field.

An operation of the magnetic sensor 10 according to the present embodiment will now be described. A solid curve in FIG. 2 represents the relationship between a measured resistance value of the TMR element 20 and the rotation angle (deg) of the external magnetic field. A chain curve in FIG. 2 represents the relationship between an ideal resistance value of the TMR element 20 and the rotation angle (deg) of the external magnetic field (this curve is marked "ideal curve" in FIG. 2). The ideal resistance value of the TMR element 20 is a value that does not include an error other than a resistance value indicative of the rotation angle of the external magnetic field. The ideal resistance value of the TMR element 20 is hereinafter simply referred to as the ideal value.

Figure 3:
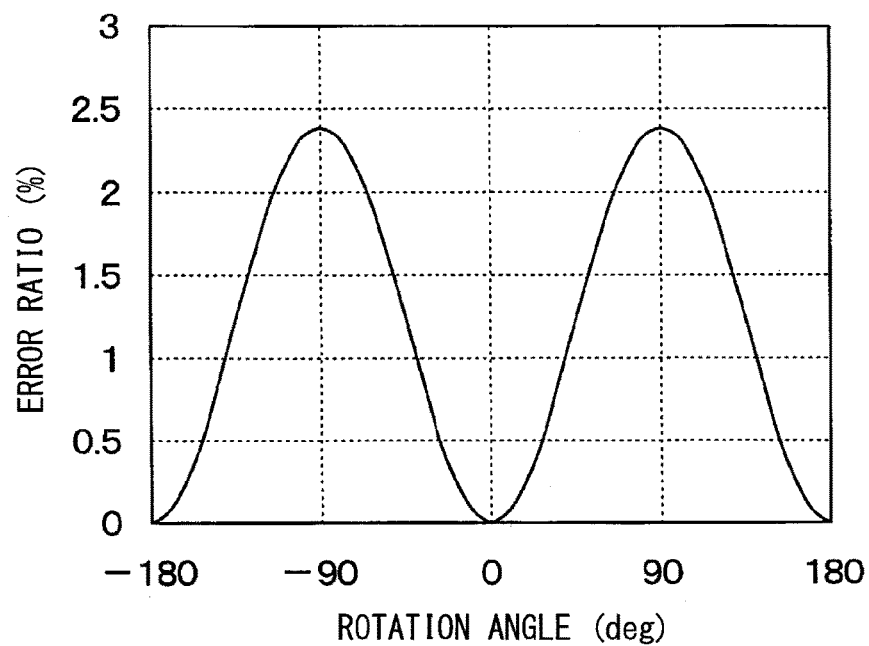
FIG. 3 is a graph illustrating the relationship between the error ratio of the TMR element in the magnetic sensor according to the first embodiment and the rotation angle of the external magnetic field.
Figure 4:
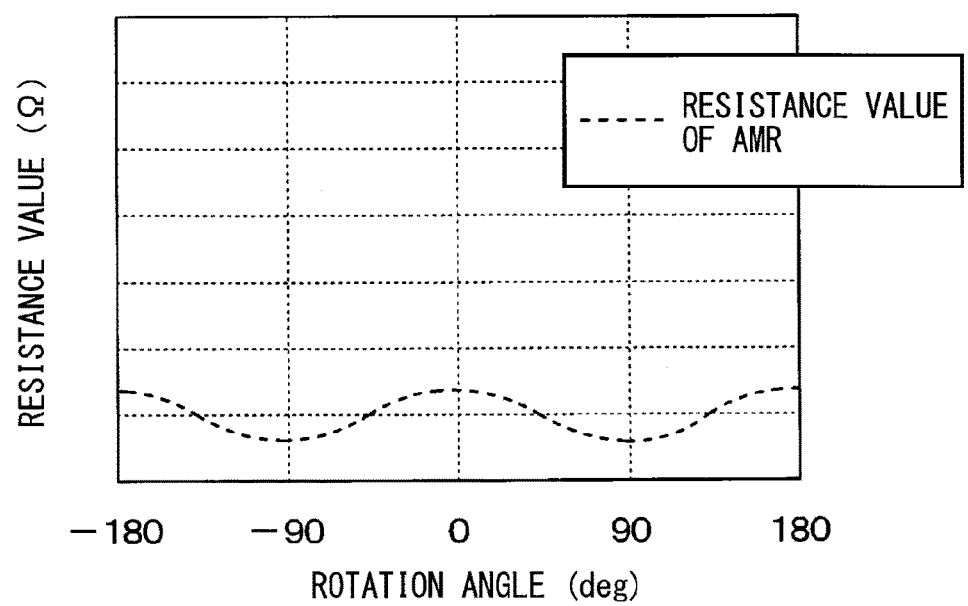
FIG. 4 is a graph illustrating the relationship between the resistance value of an AMR element in the magnetic sensor according to the first embodiment and the rotation angle of the external magnetic field.

A solid curve in FIG. 3 represents the relationship between the error ratio (%) of the resistance value of the TMR element 20 and the rotation angle (deg). When the difference between the measured resistance value and ideal resistance value of the TMR element 20 is an error R_Err, the error ratio (%) is a percentage indicative of the ratio of R_Err to the minimum measured resistance value Rmin (250Ω) (=R_Err/Rmin×100). A chain curve in FIG. 4 represents the relationship between the resistance value of the AMR element 30 and the rotation angle (deg) of the external magnetic field.

When the rotation angle of the external magnetic field varies, the resistance value of the TMR element 20 varies with the rotation angle of the external magnetic field as indicated by the solid curve in FIG. 2. Therefore, when a current flowing in the TMR element 20 is output from the TMR element 20, the output of the TMR element 20 varies with the rotation angle of the external magnetic field.

Here, the curve indicative of the relationship between the measured resistance value of the TMR element 20 and the rotation angle of the external magnetic field deviates from the ideal curve (namely, the COS curve) in FIG. 2. Therefore, the actual output of the TMR element 20 includes a component of the error R_Err (see FIG. 3). Hence, the error R_Err is a cause of an error in the measurement of the rotation angle of the external magnetic field.

To that end, the present embodiment is configured so that the TMR element 20 and the corrective AMR element 30 are series-connected between the power supply Vdd and the ground.

As indicated by the chain curve in FIG. 4, the resistance value of the corrective AMR element 30 varies with the rotation angle of the external magnetic field. Further, as mentioned earlier, the angle of the direction of easy axis of magnetization and dimensional ratio of the corrective AMR element 30 are set so that the resistance value of the corrective AMR element 30 offsets the error R_Err in the resistance value of the TMR element 20.

In the present embodiment, the error ratio (%) of the TMR element 20 is set to be approximately 2.4%.

In the magnetic sensor according to the present embodiment, which has been described above, the TMR element 20 and the corrective AMR element 30 are series-connected between the power supply Vdd and the ground. The resistance value of the corrective AMR element 30 is set to offset the output error included in the resistance value of the TMR element 20. The output error is a value indicative of the error R_Err included in the resistance value of the TMR element 20. Hence, the relationship between the combined resistance of the TMR element 20 and the corrective AMR element 30 and the rotation angle of the external magnetic field can be made close to the ideal COS curve. Therefore, the relationship between the current flowing through the TMR element 20 and the corrective AMR element 30 between the power supply Vdd and the ground (namely, the output of the magnetic sensor 10) and the rotation angle of the external magnetic field can be made close to a SIN curve. In other words, it is possible to reduce an error component that is included in the current flowing through the TMR element 20 and the corrective AMR element 30 between the power supply Vdd and the ground.

In the present embodiment, the resistance value of the corrective AMR element 30 is smaller than the resistance value of the TMR element 20 as mentioned earlier. Therefore, an increased voltage can be applied from the power supply Vdd to the TMR element 20. This makes it possible to increase, in the resistance value of the TMR element 20, the amount of change that depends on the rotation angle of the external magnetic field. Thus, it is possible to increase, in the output of the magnetic sensor 10, the amount of change that depends on the rotation angle of the external magnetic field. As a result, the sensitivity of the magnetic sensor 10 can be increased.

As is obvious from the above, the magnetic sensor 10 exhibits high sensitivity while reducing the error in the measurement of the rotation angle.

A certain conventional magnetic sensor is designed to reduce the error in angle measurement by using a measurement magnetoresistive element for measuring the rotation angle and an error correction magnetoresistive element having the same resistance value as the measurement magnetoresistive element (refer to JP 5062453 B2).

Figure 5:
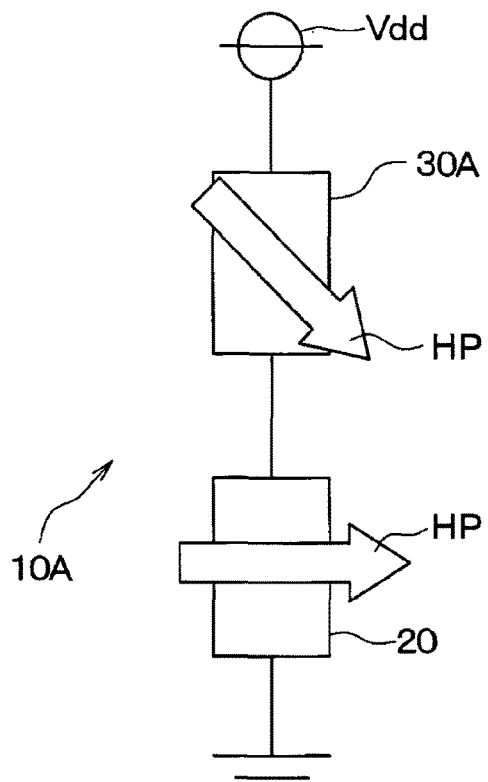
FIG. 5 is a diagram illustrating the configuration of an exemplary magnetic sensor to be compared against the magnetic sensor according to the first embodiment.

As a concrete example of such a conventional magnetic sensor, FIG. 5 shows a circuit configuration that uses the TMR element 20 as a measurement magnetoresistive element and an error correction TMR element 30A as an error correction magnetoresistive element.

A magnetic sensor 10A shown in FIG. 5 is configured so that the TMR element 20 and the error correction TMR element 30A are series-connected between the power supply Vdd and the ground. The error correction TMR element 30A has the same resistance value as the TMR element 20 and is a TMR element in which the magnetization direction Hp of the pin layer 22 is set to be different from the magnetization direction Hp of the pin layer 22 of the TMR element 20.

In contrast, in the present embodiment, the corrective AMR element 30 needs to have a resistance value according to the error R_Err.

Figure 6:
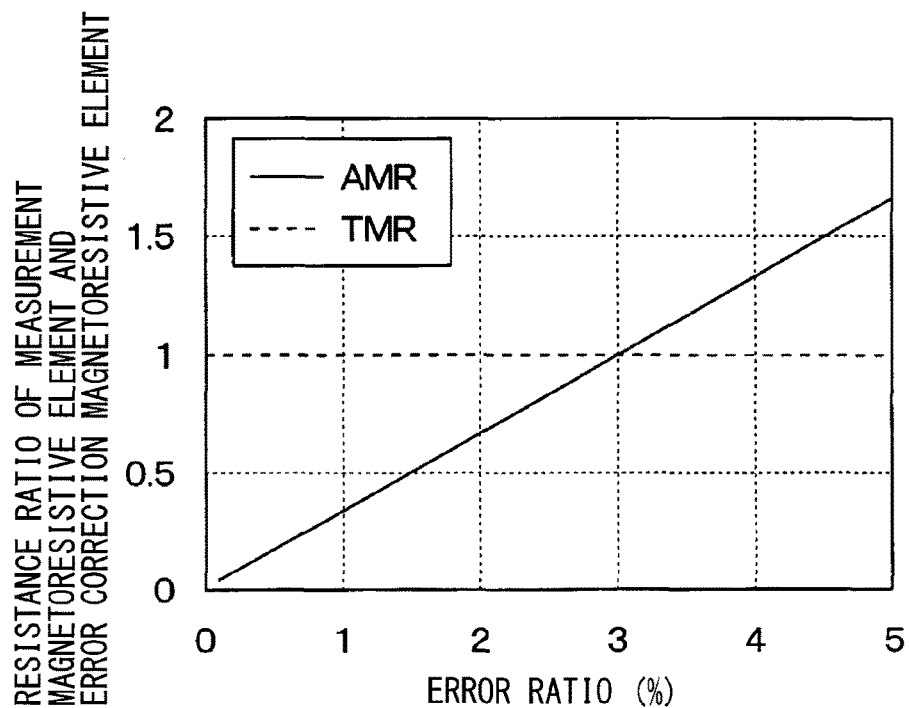
FIG. 6 is a graph illustrating the relationship between the resistance ratio and error ratio of the magnetic sensor according to the first embodiment.

FIG. 6 shows the relationship between the resistance ratio of the resistance value Rs of the measurement magnetoresistive element and the resistance value Rg of the error correction magnetoresistive element (=Rg/Rs) and an error ratio (%). A solid line in FIG. 6 represents the resistance ratio prevailing when the corrective AMR element 30 is used as the error correction magnetoresistive element. A chain line in FIG. 6 represents the resistance ratio prevailing when the error correction TMR element 30A is used as the error correction magnetoresistive element. The solid line in FIG. 6 depicts an example in which an AMR element having a resistance changing rate of 3% is used as the corrective AMR element 30.

When the error correction TMR element 30A is used as the error correction magnetoresistive element, the resistance ratio remains at "1" irrespective of the error ratio (%), as is obvious from the chain line in FIG. 6.

When the corrective AMR element 30 is used as the error correction magnetoresistive element, the resistance ratio decreases with a decrease in the error ratio (%), as is obvious from the solid line in FIG. 6.

Consequently, the current flowing in the measurement magnetoresistive element increases with a decrease in the error ratio (%).

When, for instance, the error correction TMR element 30A and the corrective AMR element 30 are of the same size and the resistance value of the error correction TMR element 30A is 1, the resistance value of the corrective AMR element 30 can be approximately 1/50.

When the magnetic sensor 10 is configured by series-connecting the measurement magnetoresistive element and the error correction magnetoresistive element between the power supply Vdd and the ground, a smaller current flows in the measurement magnetoresistive element to reduce the sensitivity compared with the case when the magnetic sensor 10 is configured by connecting only the measurement magnetoresistive element between the power supply Vdd and the ground.

In the present embodiment, in contrast, the current flowing in the measurement magnetoresistive element increases with a decrease in the error ratio (%). Therefore, when the error R_Err is limited within a small range, the magnetic sensor 10 according to the present embodiment is more favorable to the suppression of sensitivity reduction than the magnetic sensor 10A that uses the error correction TMR element 30A.

In the present embodiment, when the corrective AMR element 30 is formed by patterning a substrate, the accuracy of the resistance value is determined by such patterning.

Meanwhile, the resistance value of the error correction TMR element 30A is determined by the thicknesses of the free layer, pin layer, and tunnel layer that form the error correction TMR element 30A. In general, it is difficult to reduce the variation in the thicknesses of individual layers that form the error correction TMR element 30A. Hence, the variation in the resistance value of the corrective AMR element 30 can be reduced as compared to the error correction TMR element 30A. Consequently, the magnetic sensor 10 according to the present embodiment can reduce the variation in the characteristics of an external magnetic field measurement process.

In the magnetic sensor 10 according to the present embodiment, the corrective AMR element 30 is disposed in between the power supply Vdd and the TMR element 20. Therefore, the corrective AMR element 30 is capable of functioning as a protective element that provides protection against surge current applied from the power supply Vdd to the TMR element 20.

In the present embodiment, as is obvious from FIG. 2, the ideal resistance value of the TMR element 20 is represented by a COS curve that indicates the same value when the rotation angle changes by 360 degrees. On the other hand, as is obvious from FIGS. 2 and 3, the error R_Err in the resistance value of the TMR element 20 is represented by a SIN curve that indicates the same value when the rotation angle changes by 180 degrees. Therefore, the measured resistance value of the TMR element 20 according to the present embodiment includes an output error in a second-order term. Consequently, when the magnetic sensor 10 uses the corrective AMR element 30, the output error in the second-order term, which is included in the output of the TMR element 20 in the magnetic sensor 10, is corrected as described above.

Characteristics of the measured resistance value of the TMR element 20 in FIG. 2, characteristics of the error ratio in FIG. 3, and characteristics of the resistance value of the AMR element in FIG. 4 are merely examples. These characteristics are not limited to those indicated in FIGS. 2, 3, and 4.

The first embodiment has been described on the assumption that the corrective AMR element 30 and the TMR element 20 are series-connected between the power supply Vdd and the ground. Alternatively, however, the corrective AMR element 30 and the TMR element 20 may be parallel-connected between the power supply Vdd and the ground.

The above alternative will apply a higher voltage from the power supply Vdd to the TMR element 20 than when the TMR element 20 and the corrective TMR element, which substitutes the corrective AMR element 30, are series-connected between the power supply Vdd and the ground. This results in an increase in the sensitivity of the magnetic sensor 10. Consequently, as is the case with the first embodiment, the above alternative will increase the sensitivity of the magnetic sensor 10 while reducing the error in angle measurement.

The first embodiment has been described on the assumption that the angle of the direction of easy axis of magnetization of the corrective AMR element 30 is set to 135 degrees. However, an alternative is to perform procedures (1) and (2):

(1) Set the angle of the direction of easy axis of magnetization of the corrective AMR element 30 to 45 degrees.

(2) Configure the magnetic sensor 10 by combining the corrective AMR element 30 whose angle of the direction of easy axis of magnetization is set to 45 degrees with the corrective AMR element 30 whose angle of the direction of easy axis of magnetization is set to 135 degrees. This will enhance the effect of error correction.

Second Embodiment

The first embodiment has been described on the assumption that the magnetic sensor 10 includes one corrective AMR element 30 and one TMR element 20. A second embodiment of the present disclosure will now be described on the assumption that the magnetic sensor 10 includes two corrective AMR elements and one TMR element.

Figure 7:
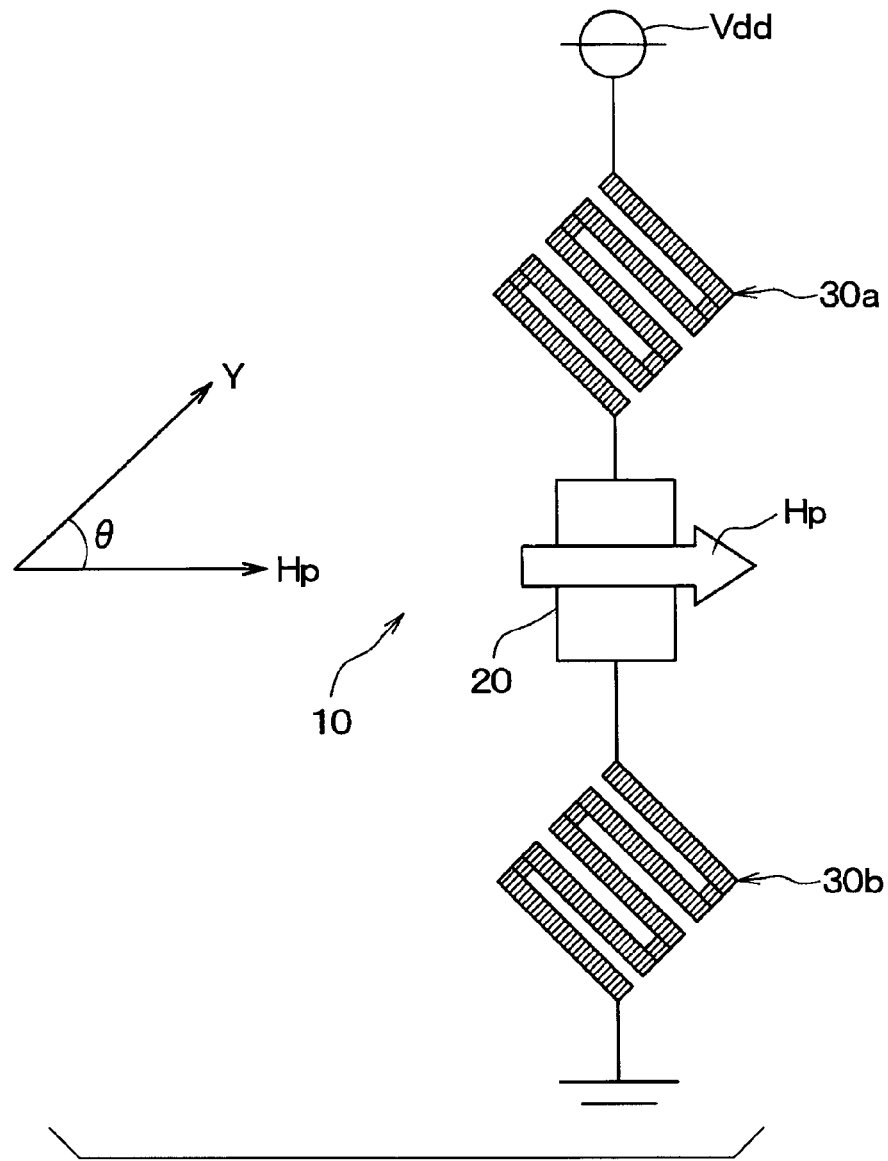
FIG. 7 is a diagram illustrating the configuration of the magnetic sensor according to a second embodiment of the present disclosure.

FIG. 7 shows the circuit configuration of the magnetic sensor 10 according to the second embodiment. As shown in FIG. 7, the magnetic sensor 10 according to the present embodiment includes corrective AMR elements 30a, 30b and the TMR element 20. The corrective AMR elements 30a, 30b and the TMR element 20 are series-connected between the power supply Vdd and the ground. The TMR element 20 is disposed between the corrective AMR elements 30a, 30b. The corrective AMR elements 30a, 30b are used in replacement of the corrective AMR element 30 according to the first embodiment. Characteristics of the corrective AMR elements 30a, 30b are the same as those of the corrective AMR element 30 according to the first embodiment except for the resistance value and the direction of easy axis of magnetization.

In the second embodiment, a combined resistance value obtained by combining the resistance values of the corrective AMR elements 30a, 30b is set so as to offset the output error included in the resistance value of the TMR element 20 in accordance with the dimensional ratio and the angle of the direction of easy axis of magnetization of the corrective AMR elements 30a, 30b. Therefore, the relationship between the rotation angle of the external magnetic field and a current flowing through the corrective AMR elements 30a, 30b and the TMR element 20 between the power supply Vdd and the ground (namely, the output of the magnetic sensor 10) can be made close to an ideal SIN curve.

In the present embodiment, the combined resistance value obtained by combining the resistance values of the corrective AMR elements 30a, 30b is smaller than the resistance value of the TMR element 20. Therefore, an increased voltage can be applied from the power supply Vdd to the TMR element 20. This makes it possible to increase, in the resistance value of the TMR element 20, the amount of change that depends on the rotation angle of the external magnetic field. Thus, it is possible to increase, in the output of the magnetic sensor 10, the amount of change that depends on the rotation angle of the external magnetic field. As a result, the sensitivity of the magnetic sensor 10 can be increased.

As is obvious from the above, the magnetic sensor 10 exhibits high sensitivity while reducing the error in angle measurement.

The magnetic sensor 10 according to the present embodiment is configured so that the corrective AMR element 30b is disposed in between the ground with respect to the TMR element 20. Therefore, the corrective AMR element 30b is capable of functioning as a protective element that provides protection against surge current applied from the ground to the TMR element 20.

Third Embodiment

The first embodiment has been described on the assumption that the TMR element 20 and the corrective AMR element 30 are formed in the same plane. A third embodiment of the present disclosure will now be described on the assumption that the TMR element 20 and the corrective AMR element 30 are formed in different planes.

Figure 8:
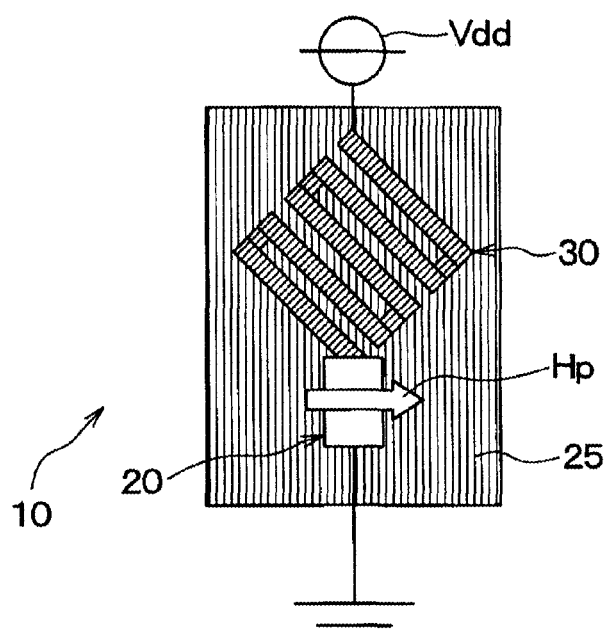
FIG. 8 is a diagram illustrating the configuration of the magnetic sensor according to a third embodiment of the present disclosure.

As shown in FIG. 8, the third embodiment is configured so that the TMR element 20 and the corrective AMR element 30 are formed in opposing layers via an insulating layer 25. Referring to FIG. 8, the TMR element 20 is formed forward of the insulating layer 25, whereas the corrective AMR element 30 is formed rearward of the insulating layer 25.

Further, in the present embodiment, the TMR element 20 and the corrective AMR element 30 are disposed to overlap each other. Therefore, the present embodiment makes it possible to reduce the area of the magnetic sensor 10.

Fourth Embodiment

The first embodiment has been described on the assumption that the magnetic sensor 10 includes one corrective AMR element 30 and one TMR element 20. A fourth embodiment of the present disclosure will now be described on the assumption that the magnetic sensor 10 includes four corrective AMR elements and four TMR elements.

Figure 9:
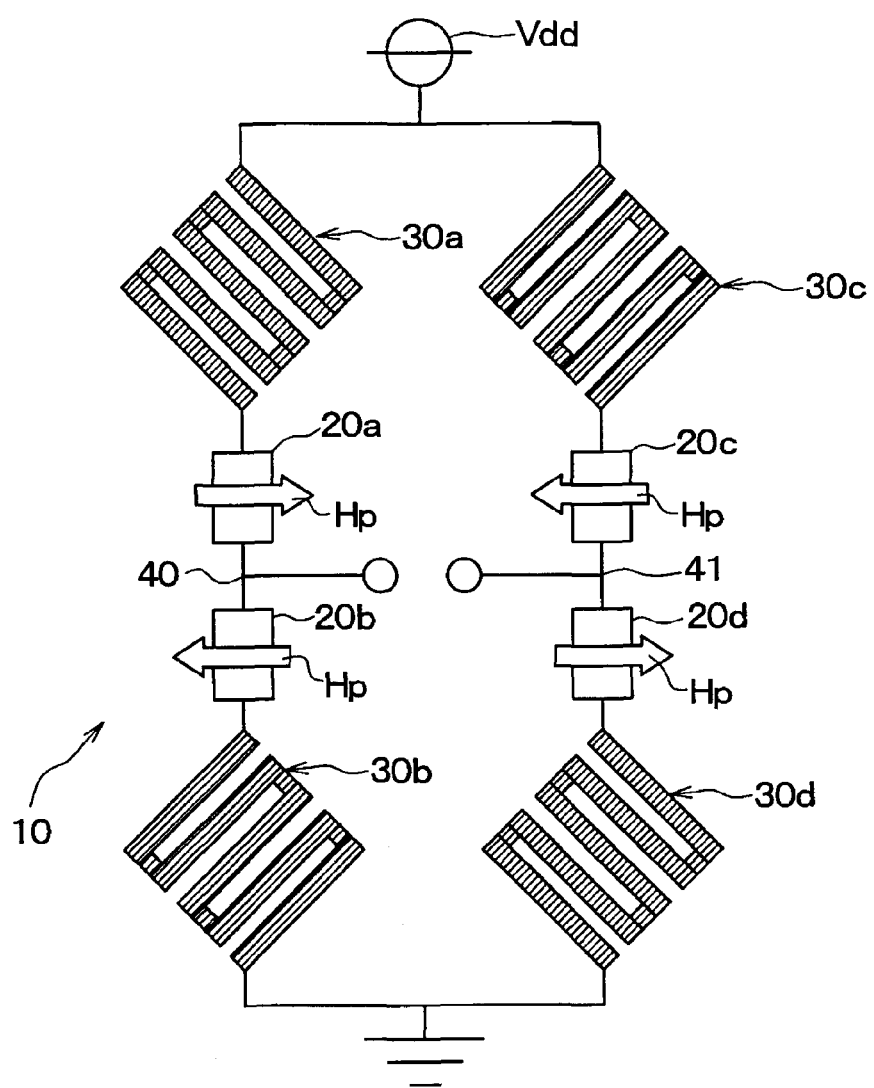
FIG. 9 is a diagram illustrating the configuration of the magnetic sensor according to a fourth embodiment of the present disclosure.

FIG. 9 shows the circuit configuration of the magnetic sensor 10 according to the fourth embodiment. As shown in FIG. 9, the magnetic sensor 10 according to the present embodiment includes corrective AMR elements 30a, 30b, 30c, 30d and TMR elements 20a, 20b, 20c, 20d.

The corrective AMR elements 30a, 30b and the TMR elements 20a, 20b are series-connected between the power supply Vdd and the ground. The TMR elements 20a, 20b are disposed between the corrective AMR elements 30a, 30b. The TMR element 20a is disposed between the power supply Vdd and the TMR element 20b. The corrective AMR element 30a is disposed between the power supply Vdd and the corrective AMR element 30b.

The resistance value of the corrective AMR element 30a is set so as to offset the output error in the rotation angle of the external magnetic field, which is included in the resistance value of the TMR element 20a. The resistance value of the corrective AMR element 30b is set so as to offset, of the resistance value of the TMR element 20b, the output error in the rotation angle of the external magnetic field.

The corrective AMR elements 30c, 30d and the TMR elements 20c, 20d are series-connected between the power supply Vdd and the ground. The TMR elements 20c, 20d are disposed between the corrective AMR elements 30c, 30d. The TMR element 20c is disposed between the power supply Vdd and the TMR element 20d. The corrective AMR element 30c is disposed between the power supply Vdd and the corrective AMR element 30d.

The resistance value of the corrective AMR element 30c is set so as to offset the output error in the rotation angle of the external magnetic field, which is included in the resistance value of the TMR element 20c. The resistance value of the corrective AMR element 30d is set so as to offset, of the resistance value of the TMR element 20d, the output error in the rotation angle of the external magnetic field.

Here, the angle between the direction of easy axis of magnetization of the corrective AMR element 30a and the magnetization direction Hp of the pin layer of the TMR element 20a is set to 135 degrees clockwise in FIG. 9. The angle between the direction of easy axis of magnetization of the corrective AMR element 30d and the magnetization direction Hp of the pin layer of the TMR element 20d is set to 135 degrees clockwise in FIG. 9. The angle between the direction of easy axis of magnetization of the corrective AMR element 30b and the magnetization direction Hp of the pin layer of the TMR element 20b is set to 45 degrees clockwise in FIG. 9. The angle between the direction of easy axis of magnetization of the corrective AMR element 30c and the magnetization direction Hp of the pin layer of the TMR element 20c is set to 45 degrees clockwise in FIG. 9.

The magnetization direction Hp of the pin layer of the TMR element 20a is opposite the magnetization direction Hp of the pin layer of the TMR element 20b. The magnetization direction Hp of the pin layer of the TMR element 20c is opposite the magnetization direction Hp of the pin layer of the TMR element 20d. The magnetization direction Hp of the pin layer of the TMR element 20a is the same as the magnetization direction Hp of the pin layer of the TMR element 20d. The magnetization direction Hp of the pin layer of the TMR element 20c is the same as the magnetization direction Hp of the pin layer of the TMR element 20b.

In the present embodiment, which is configured as described above, the TMR elements 20a, 20b and the corrective AMR elements 30c, 30d are parallel-connected between the power supply Vdd and the ground. The TMR elements 20c, 20d and the corrective AMR elements 30a, 30b are parallel-connected between the power supply Vdd and the ground.

A method of manufacturing the magnetic sensor according to the present embodiment will now be described. FIGS. 10(a) to 10(e) and FIGS. 11(a) to 11(d) illustrate processes of manufacturing the magnetic sensor 10.

Figure 10:
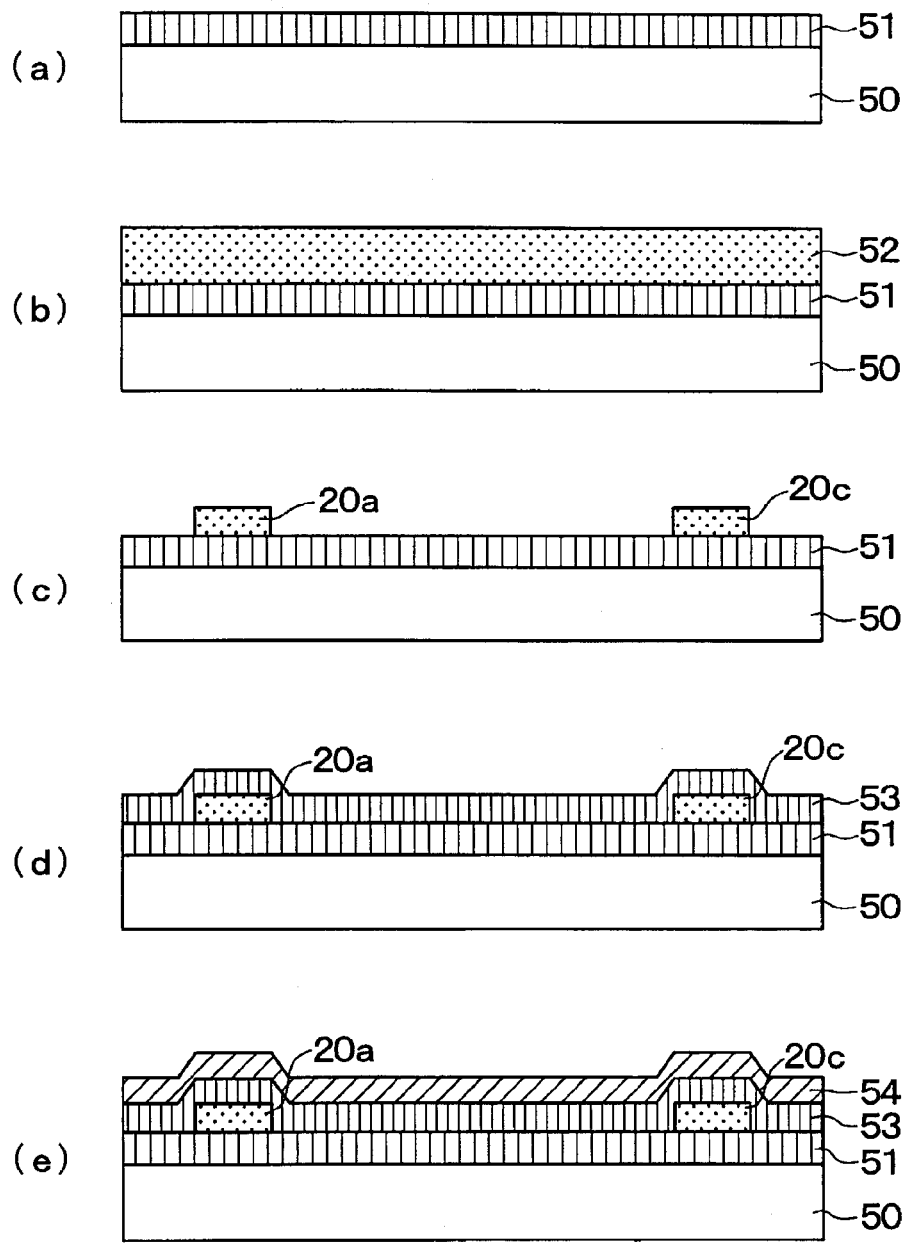
FIG. 10 illustrates processes of manufacturing the magnetic sensor according to the fourth embodiment.

In a first process, an underlying insulating film 51 is formed on a substrate 50 made of a Si wafer (silicon wafer) (FIG. 10(a)). The underlying insulating film 51 is formed, for instance, by thermal oxidation, CVD, or sputtering. Specifically, the underlying insulating film 51 is made, for instance, of $SiO_2$ or SiN.

In a second process, a TMR film 52 is formed on the underlying insulating film 51 (FIG. 10(b)). The TMR film 52 is formed of a non-magnetic film sandwiched between two magnetic films. One of the two magnetic films is used to form a free layer of the TMR elements 20a, 20c. The remaining magnetic film is used to form a pin layer of the TMR elements 20a, 20d. The non-magnetic film is used to form a tunnel layer of the TMR elements 20a, 20d.

In a third process, the TMR film 52 is subjected to photolithography and etching (for example, milling) to form the TMR elements 20a, 20d on the underlying insulating film 51 (FIG. 10(c)).

In a fourth process, a protective film 53 is formed by sputtering so as to cover the TMR elements 20a, 20c and the underlying insulating film 51 (FIG. 10(d)). The protective film 53 is an insulating film made, for instance, of $SiO_2$ or SiN.

In a fifth process, an AMR film 54 made of a magnetic film is formed by sputtering so as to cover the protective film 53 (FIG. 10(e)). The AMR film 54 is formed of a magnetic body that is used to configure the corrective AMR elements 30a, 30c.

In a sixth process, the AMR film 54 is subjected to photolithography and etching (for example, milling) to form the corrective AMR elements 30a, 30c on the protective film 53 (FIG. 11(a)).

In a seventh process, a protective film 55 is formed by sputtering so as to cover the protective film 53 and the corrective AMR elements 30a, 30c (FIG. 11(b)). The protective film 55 is an insulating film made, for instance, of $SiO_2$ or SiN.

In an eighth process, contact holes 60, 61, 62, 63 are formed, for instance, by dry etching or wet etching (FIG. 11(c)). The contact holes 60, 61 are formed to penetrate the protective films 55, 53. The contact holes 62, 63 are formed to penetrate the protective film 55. The contact holes 60, 61 correlate with the TMR elements 20a, 20c. The contact holes 62, 63 correlate with the corrective AMR elements 30a, 30c.

In a ninth process, wirings 70, 71, 72, 73, 74 are formed (FIG. 11(d)).

More specifically, sputtering is performed to bury an electrically conductive material in the contact holes 60-63 and form an electrically conductive film that covers the protective film 55. Subsequently, an unnecessary portion of the electrically conductive film, except for the wirings 70, 71, 72, 73, 74, is removed, for instance, by etching. This results in the formation of the wirings 70, 71, 72, 73, 74.

Figure 11:
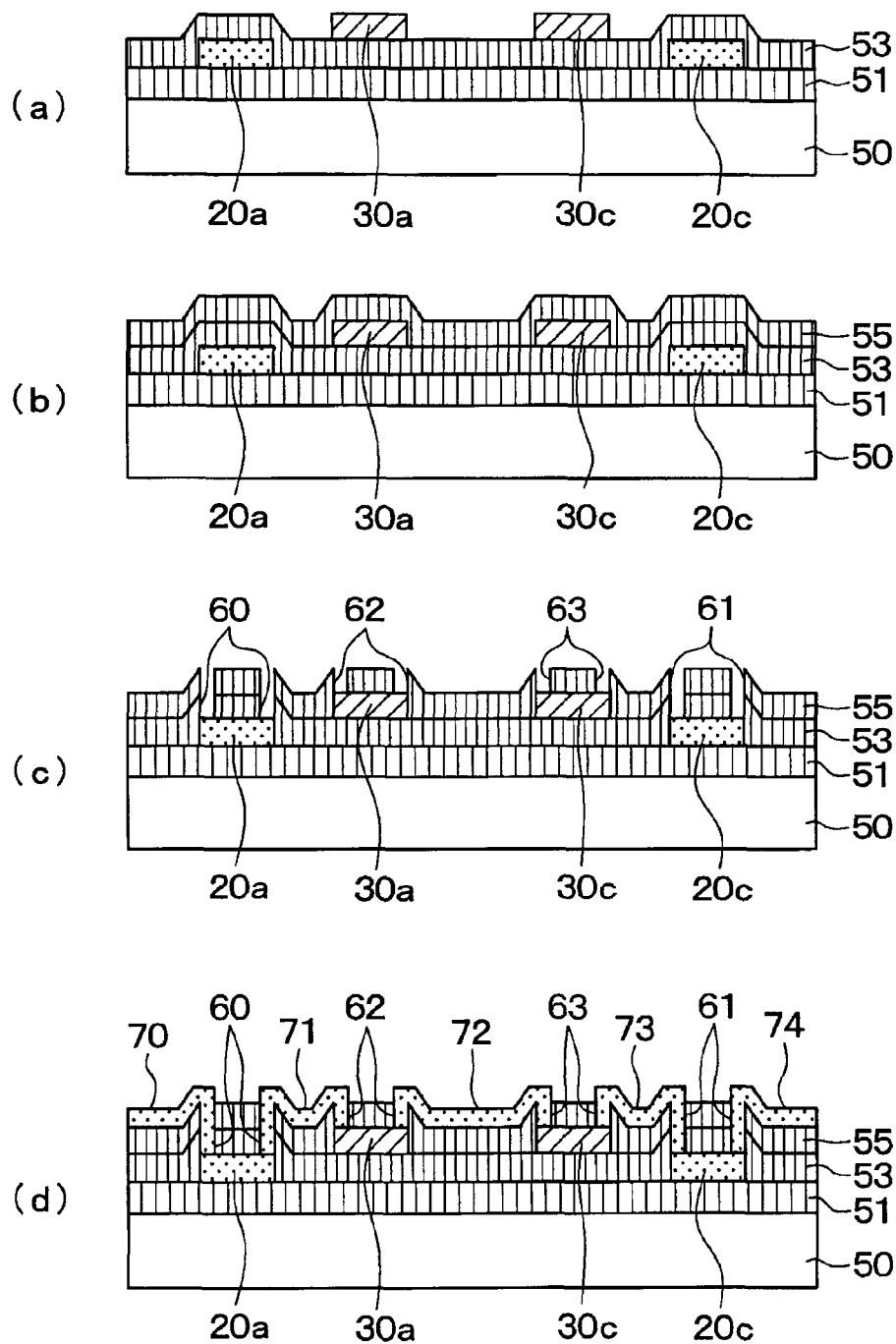
FIG. 11 illustrates processes of manufacturing the magnetic sensor according to the fourth embodiment.

The wiring 70 is used to connect the TMR element 20a to the TMR element 20b (not shown in FIG. 11). The wiring 71 is used to connect the TMR element 20a to the corrective AMR element 30a. The wiring 72 is used to connect the corrective AMR element 30a to the corrective AMR element 30c. The wiring 73 is used to connect the corrective AMR element 30c to the TMR element 20c. The wiring 74 is used to connect the TMR element 20c to the TMR element 20d (not shown in FIG. 11).

As described above, the TMR elements 20a, 20c are formed in one plane while the corrective AMR elements 30a, 30c are formed in another plane. Subsequently, the pin layers of the TMR elements 20a, 20b are magnetized so that the magnetization direction Hp of the pin layer of the TMR element 20a is opposite the magnetization direction Hp of the pin layer of the TMR element 20b.

A manufacturing method for forming the TMR elements 20b, 20d and the corrective AMR elements 30b, 30d will not be described because it is the same as the manufacturing method for forming the TMR elements 20a, 20c and the corrective AMR elements 30a, 30c.

According to the present embodiment, which has been described above, the TMR elements 20a, 20b, 20c, 20d form a bridge circuit. Therefore, an output voltage indicative of a measured angle value of the external magnetic field can be output across common connection terminals 40, 41. The common connection terminal 40 is a common connection terminal between the TMR elements 20a, 20b. The common connection terminal 41 is a common connection terminal between the TMR elements 20c, 20d.

As regards the magnetic sensor 10 that does not use the corrective AMR elements 30a, 30b, 30c, 30d, the relationship between the output voltage outputted across the common connection terminals 40, 41 and the rotation angle of the external magnetic field is close to a COS curve but cannot be represented by an ideal COS curve.

Meanwhile, the present embodiment uses the corrective AMR elements 30a, 30b, 30c, 30d to form a bridge circuit. Therefore, the corrective AMR element 30a can offset, of the resistance value of the TMR element 20a, the output error in the rotation angle of the external magnetic field. Similarly, the corrective AMR elements 30b, 30c, 30d can offset the output error in the rotation angle of the external magnetic field, the error which is included in the resistance value of a related one of the TMR elements 20b, 20c, 20d. Hence, the relationship between the output voltage outputted across the common connection terminals 40, 41 and the rotation angle of the external magnetic field can be made close to an ideal COS curve. This makes it possible to reduce the error in the rotation angle of the external magnetic field, the output error which is included in the output voltage output across the common connection terminals 40, 41. When the corrective AMR elements 30a, 30b, 30c, 30d are used to form a bridge circuit as described above, it is possible to correct not only an output error in a second-order term but also an output error in a third or higher order term.

In the present embodiment, the resistance value of the corrective AMR element 30a is smaller than that of the TMR element 20a. The resistance value of the corrective AMR element 30b is smaller than that of the TMR element 20b. The resistance value of the corrective AMR element 30c is smaller than that of the TMR element 20c. The resistance value of the corrective AMR element 30d is smaller than that of the TMR element 20d. Hence, an increased voltage can be applied from the power supply Vdd to the TMR element 20a. This makes it possible to increase the amount of change in the resistance value of the TMR element 20a, which depends on the rotation angle of the external magnetic field. Similarly, it is possible to increase, in the resistance value of the TMR elements 20b, 20c, 20d, the amount of change that depends on the rotation angle of the external magnetic field. Consequently, it is possible to increase the amount of change in the output of the magnetic sensor 10 (namely, the output voltage of the common connection terminals 40, 41), which depends on the rotation angle of the external magnetic field. As a result, the sensitivity of the magnetic sensor 10 can be increased.

As is obvious from the above, the magnetic sensor 10 exhibits high sensitivity while reducing the error in angle measurement.

In the present embodiment, the TMR elements 20a, 20b, 20c, 20d form a bridge circuit. The corrective AMR elements 30a, 30b, 30c, 30d form a bridge circuit. Further, the voltage developed across the common connection terminals 40, 41 is used as an output indicative of a measured angle value of the external magnetic field. Therefore, it is possible to reduce the error in the rotation angle of the external magnetic field, which is attributable to temperature changes. Consequently, the temperature characteristics of the magnetic sensor 10 can be improved.

In the present embodiment, the corrective AMR element 30a is disposed between the power supply Vdd and the TMR elements 20a, 20b. This makes it possible to increase the resistance to surge current that flows from the power supply Vdd toward the TMR elements 20a, 20b. The corrective AMR element 30c is disposed between the power supply Vdd and the TMR elements 20c, 20d. This makes it possible to increase the resistance to surge current that flows from the power supply Vdd toward the TMR elements 20c, 20d.

The corrective AMR element 30b is disposed between the ground and the TMR elements 20a, 20b. This makes it possible to increase the resistance to surge current that flows from the ground toward the TMR elements 20a, 20b. The corrective AMR element 30d is disposed between the ground and the TMR elements 20c, 20d. This makes it possible to increase the resistance to surge current that flows from the ground toward the TMR elements 20c, 20d.

The fourth embodiment has been described on the assumption that the TMR elements 20a, 20b are disposed between the corrective AMR elements 30a, 30b, and that the TMR elements 20c, 20d are disposed between the corrective AMR elements 30c, 30d. However, an alternative is to dispose the corrective AMR elements 30a, 30b between the TMR elements 20a, 20b and dispose the corrective AMR elements 30c, 30d between the TMR elements 20c, 20d.

Fifth Embodiment

The fourth embodiment has been described on the assumption that a TMR element and a corrective AMR element that are related to each other (for example, the TMR element 20a and the corrective AMR element 30a) are series-connected between the power supply Vdd and the ground. A fifth embodiment of the present disclosure will now be described on the assumption that a TMR element and a corrective AMR element that are related to each other are parallel-connected between the power supply Vdd and the ground.

Figure 12:
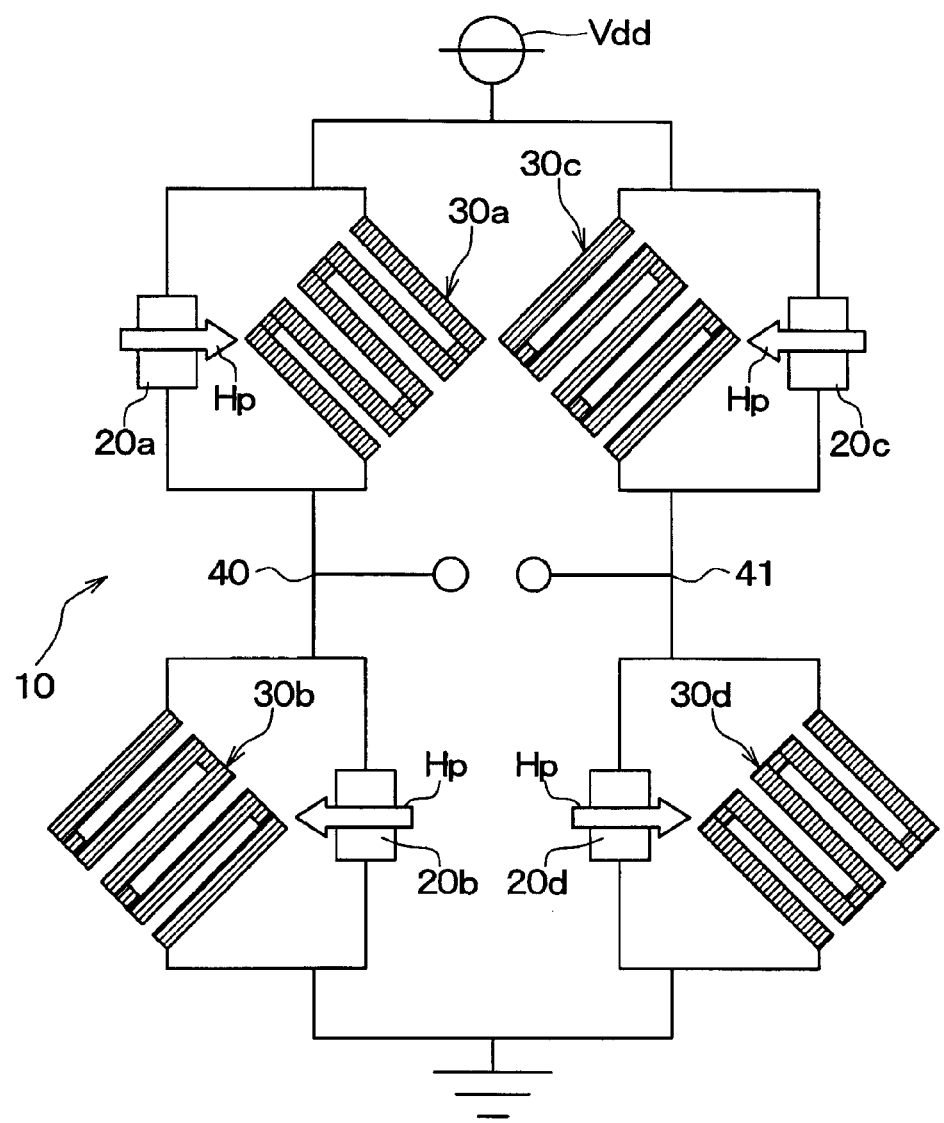
FIG. 12 is a diagram illustrating the configuration of the magnetic sensor according to a fifth embodiment of the present disclosure.

FIG. 12 shows the circuit configuration of the magnetic sensor 10 according to the fifth embodiment. In the magnetic sensor 10 according to the present embodiment, the TMR element 20a and the corrective AMR element 30a are parallel-connected between the power supply Vdd and the ground. The TMR element 20b and the corrective AMR element 30b are parallel-connected between the power supply Vdd and the ground. The TMR element 20c and the corrective AMR element 30c are parallel-connected between the power supply Vdd and the ground. The TMR element 20d and the corrective AMR element 30d are parallel-connected between the power supply Vdd and the ground.

According to the present embodiment, which has been described above, the TMR elements 20a, 20b, 20c, 20d form a bridge circuit. The corrective AMR elements 30a, 30b, 30c, 30d form a bridge circuit. The corrective AMR elements 30a, 30b, 30c, 30d can offset the output error in the rotation angle of the external magnetic field, the output error which is included in the resistance value of a related one of the TMR elements 20a, 20b, 20c, 20d. Hence, the relationship between the output voltage output across the common connection terminals 40, 41 and the rotation angle of the external magnetic field can be made close to an ideal COS curve. Therefore, as is the case with the fourth embodiment, the fifth embodiment makes it possible to reduce the error in the rotation angle of the external magnetic field, the error which is included in the output voltage output across the common connection terminals 40, 41.

The TMR element 20a and the corrective AMR element 30a are parallel-connected between the power supply Vdd and the ground. Therefore, an increased voltage can be applied from the power supply Vdd to the TMR element 20a. This makes it possible to increase the amount of change in the resistance value of the TMR element 20a, which depends on the rotation angle of the external magnetic field. Similarly, the TMR element 20b and the corrective AMR element 30b are parallel-connected between the power supply Vdd and the ground. The TMR element 20c and the corrective AMR element 30c are parallel-connected. The TMR element 20d and the corrective AMR element 30d are parallel-connected. Therefore, an increased voltage can be applied from the power supply Vdd to the TMR elements 20b, 20c, 20d. This makes it possible to increase, in the resistance value of the TMR elements 20b, 20c, 20d, the amount of change that depends on the rotation angle of the external magnetic field. Consequently, the sensitivity of the magnetic sensor 10 can be increased, as is the case with the fourth embodiment.

As is obvious from the above, the magnetic sensor 10 exhibits high sensitivity while reducing the error in angle measurement.

Sixth Embodiment

The first embodiment has been described on the assumption that the resistance value of the TMR element 20 is used to measure the rotation angle of external magnetic field. A sixth embodiment of the present disclosure will now be described on the assumption that the resistance value of the TMR element 20 is used to measure the intensity of the external magnetic field.

Figure 13:
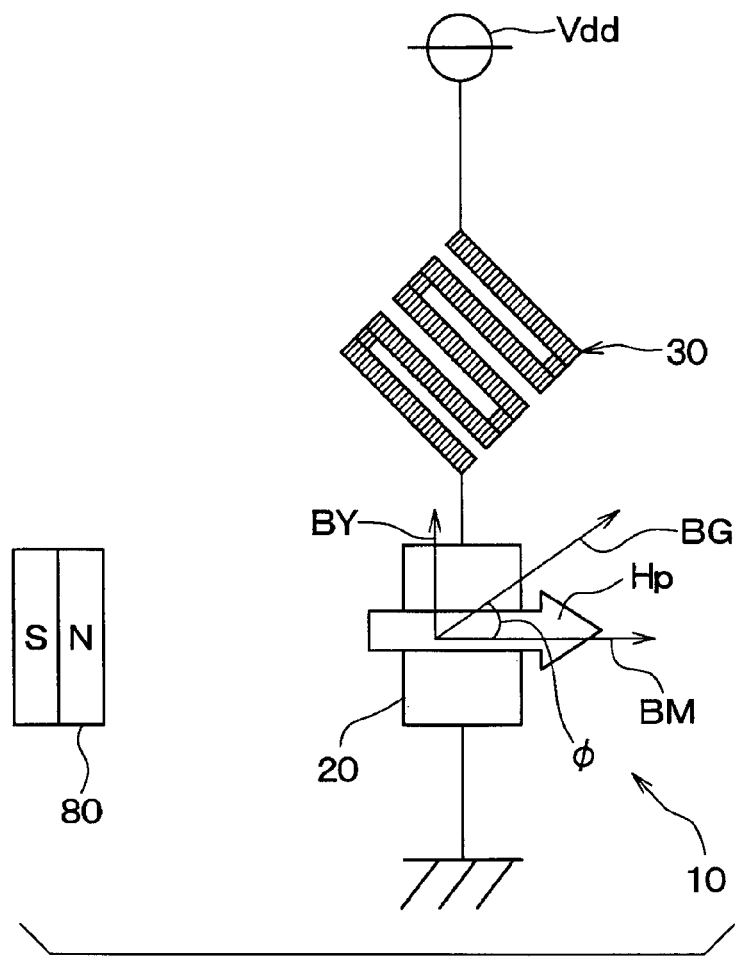
FIG. 13 is a diagram illustrating the configuration of the magnetic sensor according to a sixth embodiment of the present disclosure.

FIG. 13 shows the circuit configuration of the magnetic sensor 10 according to the sixth embodiment. In FIG. 13, elements identical to those shown in FIG. 1 are designated by the same reference signs.

In the present embodiment, a composite magnetic field BG formed by an external magnetic field BY and a bias magnetic field BM generated from a bias magnet 80 is given to the magnetic sensor 10. The direction of the bias magnetic field BM is predetermined. Further, the direction of the external magnetic field BY is also predetermined. In the present embodiment, the angle between the external magnetic field BY and the bias magnetic field BM is set to 90 degrees.

In the present embodiment, which is described above, the angle ϕ between the composite magnetic field BG and the magnetization direction Hp of the pin layer 22 can be measured by using a current flowing through the TMR element 20 and the corrective AR element 30, as is the case with the first embodiment. The angle ϕ and the intensity of the external magnetic field BY are in a one-to-one relation. Therefore, the intensity of the external magnetic field BY can be accurately measured by measuring the angle ϕ.

The magnetic sensor 10 according to the present embodiment has the same configuration as the magnetic sensor 10 according to the first embodiment. In the present embodiment, therefore, the sensitivity of the magnetic sensor 10 can be increased, as is the case with the first embodiment. Consequently, the magnetic sensor 10 according to the present embodiment exhibits high sensitivity while reducing the error in the measurement of the intensity of the external magnetic field.

The first to fifth embodiments have been described on the assumption that the resistance value of the TMR element 20 is used to measure the rotation angle of the external magnetic field. Alternatively, however, the resistance value of the TMR element 20 may be used to measure the intensity of the external magnetic field, as is the case with the sixth embodiment.

Other Embodiments

The first and second embodiments have been described on the assumption that one TMR element 20 is disposed between the power supply Vdd and the ground. Alternatively, however, two or more TMR elements 20 may be disposed between the power supply Vdd and the ground.

The second, fourth, and fifth embodiments have been described on the assumption that two AMR elements are disposed between the power supply Vdd and the ground. Alternatively, however, three or more AMR elements 30 may be disposed between the power supply Vdd and the ground.

The fourth embodiment has been described on the assumption that the TMR elements 20a, 20c are formed in one plane while the corrective AMR elements 30a, 30c are formed in another plane. Alternatively, however, the TMR elements 20a, 20c may be formed in the same plane as the corrective AMR elements 30a, 30c, as shown in FIG. 14.

Figure 14:
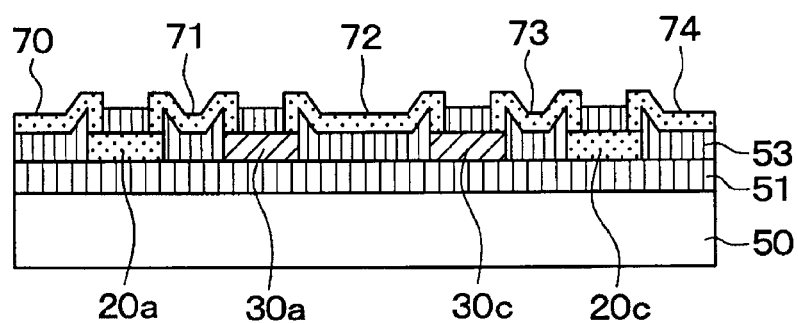
FIG. 14 is a diagram illustrating the configuration of the magnetic sensor according to another embodiment of the present disclosure.
Figure 15:
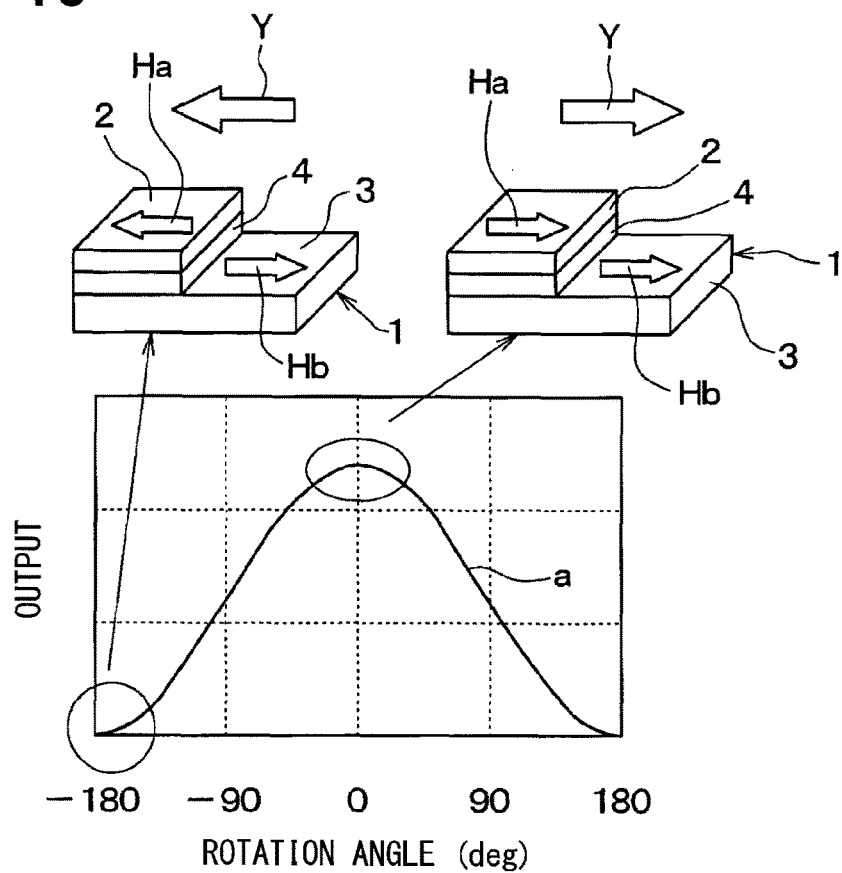
FIG. 15 is a diagram illustrating a conventional magnetic sensor.
Figure 16:
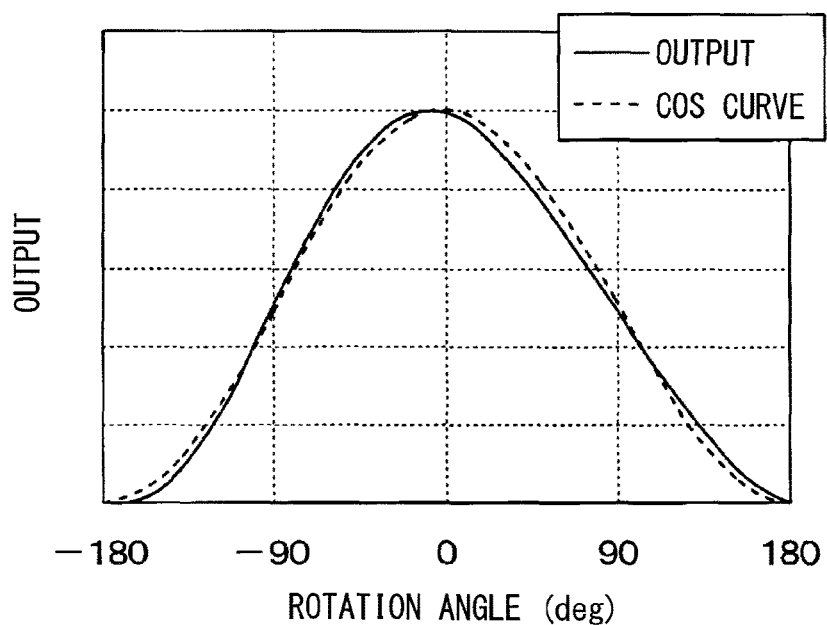
FIG. 16 is a diagram illustrating the conventional magnetic sensor.

FIG. 14 shows an example in which the TMR elements 20a, 20c and the corrective AMR elements 30a, 30c are formed on the underlying insulating film 51.

The first to sixth embodiments have been described on the assumption that a TMR element is used as the magnetoresistive element according to the present disclosure. Alternatively, however, a giant magneto-resistance (GMR) element may be used as the magnetoresistive element according to the present disclosure.

Two or more of the first to sixth embodiments and the other embodiments described above may be combined to implement the present disclosure as far as they are combinable.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A magnetic sensor comprising:
  a magnetoresistive element including
    a magnetization fixing layer whose magnetization direction is fixed with respect to an external magnetic field,
    a ferromagnetic layer whose magnetization direction rotates in accordance with the external magnetic field, and
    a non-magnetic interlayer that is sandwiched between the magnetization fixing layer and the ferromagnetic layer, the non-magnetic interlay having a resistance value that varies in accordance with an angle between the magnetization direction of the magnetization fixing layer and the magnetization direction of the ferromagnetic layer; and
  an anisotropic magnetoresistive element having a resistance value that is smaller than a resistance value of the magnetoresistive element and varies with a rotation angle of the external magnetic field,
  wherein the external magnetic field is measured in accordance with a combined resistance value obtained by combining the resistance value of the magnetoresistive element and the resistance value of the anisotropic magnetoresistive element, and
  wherein the resistance value of the anisotropic magnetoresistive element is set to offset an output error in the rotation angle, the output error being included in the resistance value of the magnetoresistive element.

2. The magnetic sensor according to claim 1, wherein the angle between the direction of easy axis of magnetization of the anisotropic magnetoresistive element and the magnetization direction of the magnetization fixing layer is set so that the resistance value of the anisotropic magnetoresistive element offsets the output error in the rotation angle, the output error being included in the resistance value of the magnetoresistive element.

3. The magnetic sensor according to claim 1, wherein the magnetoresistive element and the anisotropic magnetoresistive element are series-connected between a power supply and a ground.

4. The magnetic sensor according to claim 1, wherein the magnetoresistive element and the anisotropic magnetoresistive element are parallel-connected between a power supply and a ground.

5. The magnetic sensor according to claim 1, wherein the magnetoresistive element and the anisotropic magnetoresistive element measure the rotation angle of the external magnetic field.

6. The magnetic sensor according to claim 1, wherein the magnetoresistive element and the anisotropic magnetoresistive element measure an intensity of the external magnetic field.

7. The magnetic sensor according to claim 1, wherein the anisotropic magnetoresistive element includes one of a metal and a metal alloy, the metal including one metal of Ni, Fe, and Co, the metal alloy including at least two metals of Ni, Fe, and Co.

8. The magnetic sensor according to claim 1, wherein the magnetoresistive element and the anisotropic magnetoresistive element are formed in an identical plane.

9. The magnetic sensor according to claim 1, wherein the magnetoresistive element and the anisotropic magnetoresistive element are formed in different planes.

10. The magnetic sensor according to claim 1, wherein a plurality of the magnetoresistive elements are disposed.

11. The magnetic sensor according to claim 10, wherein the plurality of the magnetoresistive elements form a bridge circuit.

12. The magnetic sensor according to claim 11, wherein a plurality of the anisotropic magnetoresistive elements are disposed.

13. The magnetic sensor according to claim 12, wherein the plurality of the anisotropic magnetoresistive elements form a bridge circuit.

14. The magnetic sensor according to claim 1, wherein at least two anisotropic magnetoresistive elements are disposed; and wherein the magnetoresistive element is disposed between the two anisotropic magnetoresistive elements.

15. The magnetic sensor according to claim 1, wherein the magnetoresistive element is a TMR (Tunnel Magnet-Resisitive) element.

16. The magnetic sensor according to claim 1, wherein the magnetoresistive element is a GMR (Giant Magneto-Resistive) element.

17. A magnetic sensor comprising:
a magnetoresistive element including
a magnetization fixing layer whose magnetization direction is fixed with respect to an external magnetic field,
a ferromagnetic layer whose magnetization direction rotates in accordance with the external magnetic field, and
a non-magnetic interlayer that is sandwiched between the magnetization fixing layer and the ferromagnetic layer, the non-magnetic interlay having a resistance value that varies in accordance with an angle between the magnetization direction of the magnetization fixing layer and the magnetization direction of the ferromagnetic layer; and
an anisotropic magnetoresistive element having a resistance value that is smaller than a resistance value of the magnetoresistive element and varies with a rotation angle of the external magnetic field,
wherein the external magnetic field is measured in accordance with a combined resistance value obtained by combining the resistance value of the magnetoresistive element and the resistance value of the anisotropic magnetoresistive element, and
wherein at least two anisotropic magnetoresistive elements are disposed; and wherein the magnetoresistive element is disposed between the two anisotropic magnetoresistive elements.

18. The magnetic sensor according to claim 17, wherein the magnetoresistive element and the anisotropic magnetoresistive element are series-connected between a power supply and a ground.

19. The magnetic sensor according to claim 17, wherein the magnetoresistive element and the anisotropic magnetoresistive element are parallel-connected between a power supply and a ground.

20. The magnetic sensor according to claim 17, wherein the magnetoresistive element and the anisotropic magnetoresistive element measure the rotation angle of the external magnetic field.

21. The magnetic sensor according to claim 17, wherein the magnetoresistive element and the anisotropic magnetoresistive element measure an intensity of the external magnetic field.

22. The magnetic sensor according to claim 17, wherein the anisotropic magnetoresistive element includes one of a metal and a metal alloy, the metal including one metal of Ni, Fe, and Co, the metal alloy including at least two metals of Ni, Fe, and Co.

23. The magnetic sensor according to claim 17, wherein the magnetoresistive element and the anisotropic magnetoresistive element are formed in an identical plane.

24. The magnetic sensor according to claim 17, wherein the magnetoresistive element and the anisotropic magnetoresistive element are formed in different planes.

25. The magnetic sensor according to claim 17, wherein a plurality of the magnetoresistive elements are disposed.

26. The magnetic sensor according to claim 25, wherein the plurality of the magnetoresistive elements form a bridge circuit.

27. The magnetic sensor according to claim 26, wherein a plurality of the anisotropic magnetoresistive elements are disposed.

28. The magnetic sensor according to claim 27, wherein the plurality of the anisotropic magnetoresistive elements form a bridge circuit.

29. The magnetic sensor according to claim 17, wherein the magnetoresistive element is a TMR (Tunnel Magnet-Resisitive) element.

30. The magnetic sensor according to claim 17, wherein the magnetoresistive element is a GMR (Giant Magneto-Resistive) element.

* * * * *